United States Patent
Hu

(10) Patent No.: US 9,042,086 B2
(45) Date of Patent: May 26, 2015

(54) ELECTRONIC DEVICE WITH MOVABLE FOOT PAD

(71) Applicant: Acer Incorporated, Taipei Hsien (TW)

(72) Inventor: Li-Hau Hu, Taipei Hsien (TW)

(73) Assignee: ACER INCORPORATED, Taipei Hsien (TW)

( * ) Notice: Subject to any disclaimer, the term of this patent is extended or adjusted under 35 U.S.C. 154(b) by 263 days.

(21) Appl. No.: 13/686,307

(22) Filed: Nov. 27, 2012

(65) Prior Publication Data

US 2013/0208436 A1    Aug. 15, 2013

(30) Foreign Application Priority Data

Feb. 10, 2012  (TW) .............................. 101104288 A

(51) Int. Cl.
| | | |
|---|---|---|
| *H05K 5/00* | (2006.01) | |
| *H05K 7/00* | (2006.01) | |
| *H05K 7/02* | (2006.01) | |
| *H05K 7/04* | (2006.01) | |
| *G06F 1/16* | (2006.01) | |

(52) U.S. Cl.
CPC ................ *H05K 7/02* (2013.01); *G06F 1/1643* (2013.01); *G06F 1/1679* (2013.01)

(58) Field of Classification Search
CPC ....... H05K 7/142; H05K 3/301; H05K 3/325; G06F 1/184; G06F 1/185; G06F 1/1616; G06F 1/1656; G06F 1/1632; G06F 1/1626; Y02E 60/12
See application file for complete search history.

(56) References Cited

U.S. PATENT DOCUMENTS

| | | | | | |
|---|---|---|---|---|---|
| 5,121,521 | A | * | 6/1992 | Hagiwara et al. ................ | 16/278 |
| 7,187,537 | B2 | * | 3/2007 | Liao ......................... | 361/679.09 |
| 7,591,395 | B2 | * | 9/2009 | Hamaguchi ................... | 220/830 |
| 7,702,255 | B2 | * | 4/2010 | Ishii .............................. | 399/124 |
| 8,200,300 | B2 | * | 6/2012 | Wang et al. ................ | 455/575.4 |
| 8,296,906 | B2 | * | 10/2012 | Wisniewski .................... | 16/370 |
| 8,305,740 | B2 | * | 11/2012 | Chuang .................... | 361/679.01 |
| 8,305,753 | B2 | * | 11/2012 | Chang ...................... | 361/679.59 |
| 8,306,584 | B2 | * | 11/2012 | Yeh et al. ................... | 455/575.4 |
| 8,619,415 | B1 | * | 12/2013 | Lam et al. ................ | 361/679.26 |
| 2005/0252759 | A1 | * | 11/2005 | Ichimaru ....................... | 200/523 |

(Continued)

FOREIGN PATENT DOCUMENTS

| | | |
|---|---|---|
| TW | M250204 | 11/2004 |
| TW | 200833218 | 8/2008 |
| TW | M370279 | 12/2009 |

OTHER PUBLICATIONS

English language translation of abstract of TW M250204 (published Nov. 11, 2004).

(Continued)

*Primary Examiner* — Hoa C Nguyen
*Assistant Examiner* — Xanthia C Cunningham
(74) *Attorney, Agent, or Firm* — McClure, Qualey & Rodack, LLP

(57) ABSTRACT

An electronic device is provided, including a main body, a display, a foot pad and a transmission unit. The display is pivotally connected to the main body, and the foot pad is disposed on the bottom side of the main body and contacts a supporting surface parallel thereto. The transmission unit is disposed in the main body and connects the foot pad with the display. When the display rotates from a closed position to an open position relative to the main body, the foot pad moves in a first direction parallel to the supporting surface.

9 Claims, 4 Drawing Sheets

(56) References Cited

U.S. PATENT DOCUMENTS

| | | | |
|---|---|---|---|
| 2006/0006093 A1* | 1/2006 | Yang | 206/701 |
| 2006/0244700 A1* | 11/2006 | Sano et al. | 345/87 |
| 2009/0231786 A1* | 9/2009 | Takamori et al. | 361/679.01 |
| 2009/0286574 A1* | 11/2009 | Kim et al. | 455/566 |
| 2010/0265686 A1* | 10/2010 | Kilpinen | 361/807 |
| 2010/0277860 A1* | 11/2010 | Jeong et al. | 361/679.27 |
| 2011/0157780 A1* | 6/2011 | Wang et al. | 361/679.01 |
| 2011/0263304 A1* | 10/2011 | Laido et al. | 455/575.3 |
| 2013/0016489 A1* | 1/2013 | Yeh et al. | 361/807 |

OTHER PUBLICATIONS

English language translation of abstract of TW 200833218 (published Aug. 1, 2008).

English language translation of abstract of TW M370279 (published Dec. 1, 2009).

* cited by examiner

ELECTRONIC DEVICE WITH MOVABLE FOOT PAD

CROSS REFERENCE TO RELATED APPLICATIONS

This Application claims priority of Taiwan Patent Application No. 101104288, filed on Feb. 10, 2012, the entirety of which is incorporated by reference herein.

BACKGROUND OF THE INVENTION

1. Field of the Invention

The application relates in general to an electronic device and in particular to an electronic device having a movable foot pad.

2. Description of the Related Art

With rapid progress of touch control technology, notebook computers with touch screens have become popular. Since the notebook computer may be shaken or tilted backward when a user touches the touch screen, it is inconvenient to operate the touch screen. In order to stabilize the notebook computer, a thick pad may be disposed on the bottom side of the notebook computer to prevent shaking or backward tilting thereof. However, this may increase the thickness of the notebook computer and reduce portability thereof.

BRIEF SUMMARY OF INVENTION

An embodiment of the invention provides an electronic device, comprising a main body, a display, a foot pad and a transmission unit. The display is pivotally connected to the main body, and the foot pad is disposed on the bottom side of the main body and contacts a supporting surface parallel thereto. The transmission unit is disposed in the main body and connects the foot pad with the display. When the display rotates from a closed position to an open position relative to the main body, the foot pad moves in a first direction parallel to the supporting surface.

DETAILED DESCRIPTION OF INVENTION

Figure 1A:
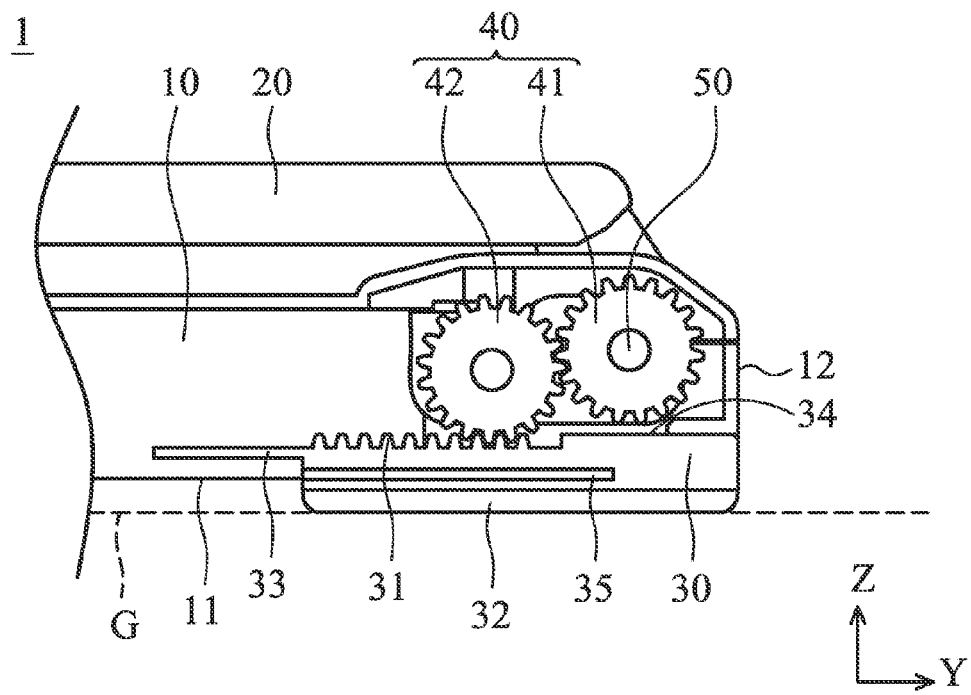
FIGS. 1A and 1B are perspective diagrams of an electronic device with the display in a closed position relative to the main body according to an embodiment of the invention.

Referring to FIG. 1A, an embodiment of an electronic device 1, such as a notebook computer, primarily comprises a main body 10, a display 20, a foot pad 30, and a transmission unit 40. As shown in FIG. 1A, the display 20 is pivotally connected to a side of the main body 10 and is rotatable relative thereto. The foot pad 30 is disposed at an edge on the bottom side of the main body 10, adjacent to the display 20, and protrudes from the bottom surface 11 of the main body 10 to contact a supporting surface G. The main body 10 and the foot pad 30 are substantially parallel to the supporting surface G. Additionally, the transmission unit 40 is disposed in the main body 10 and connects the display 20 with the foot pad 30.

In this embodiment, the transmission unit 40 primarily comprises a first gear 41 and a second gear 42. The first gear 41 is pivotally connected to the display 20 via the shaft 50, and the second gear 42 is pivotally connected to the main body 10 and engaged with the first gear 41 and a gear rack 31 of the foot pad 30. The first gear 41 may comprises metal, and the second gear 42 may comprises plastic, to reduce noise during operation. As shown in FIG. 1A, an elastic portion 32 of the foot pad 30 protrudes from the bottom surface 11 of the main body 10, and at least one guiding portion 35 is movably connected to the main body 10, such that the foot pad 30 can move relative to the main body 10 along the Y axis via the guiding portion 35.

Figure 1B:
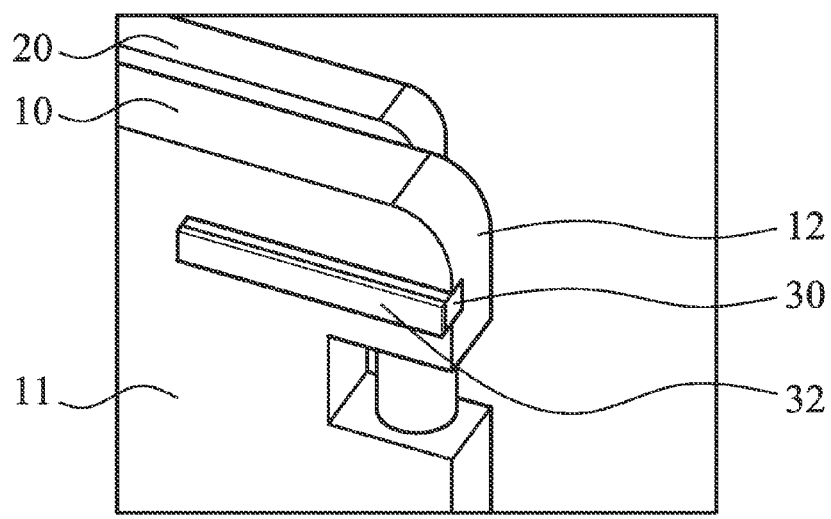

As shown in FIG. 1B, when the display 20 is in a closed position relative to the main body 10, the foot pad 30 is hidden and aligned with the back side 12 of the main body 10. Additionally, the elastic portion 32 of the foot pad 30 protrudes from the bottom surface 11 of the main body 10.

Figure 2:
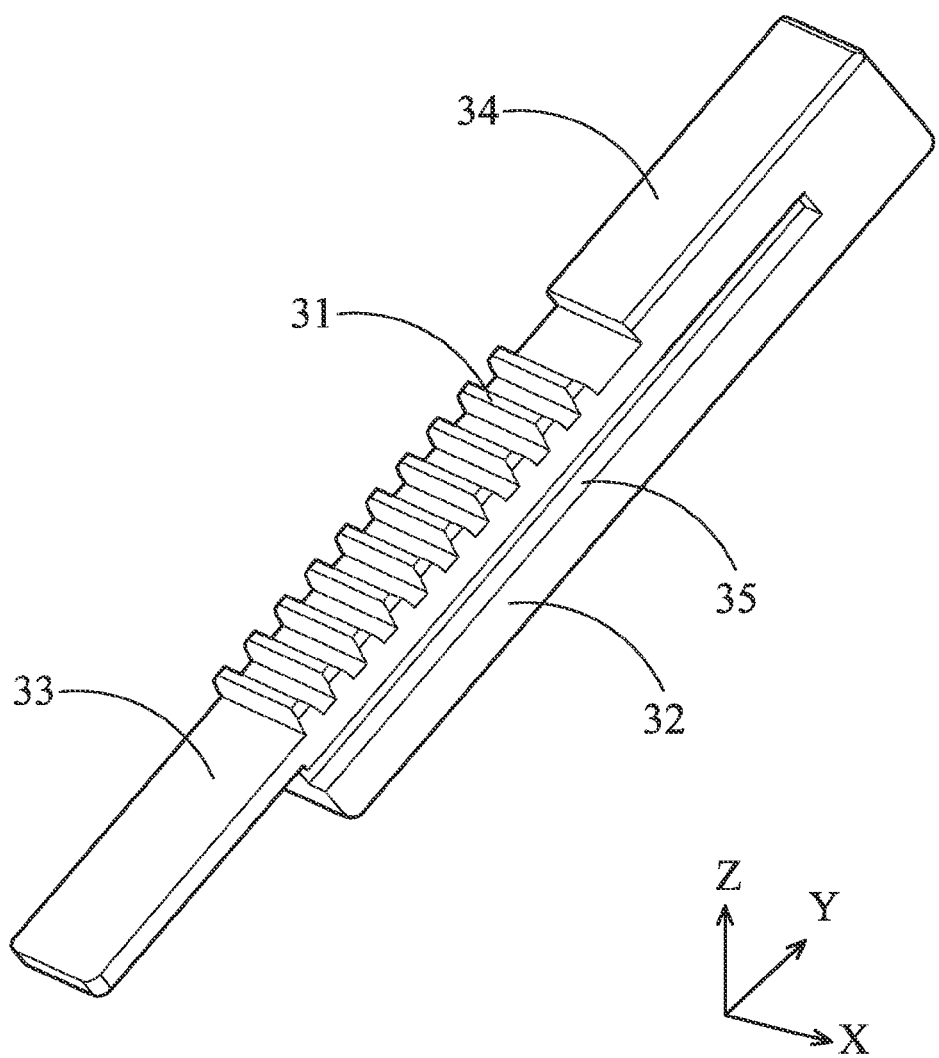
FIG. 2 is a perspective diagram of a foot pad according to an embodiment of the invention.

Referring to FIG. 2, the foot pad 30 primarily comprises a gear rack 31, an elastic portion 32, a shelter portion 33, a flat portion 34, and at least one guiding portion 35. The flat portion 34 is formed on the top side of the foot pad 30 and at one end thereof. The shelter portion 33 is formed on the top side and at the other end of the foot pad 30 relative to the flat portion 34. As shown in FIG. 2, the shelter portion 33 is thin (along the Z direction) and forms a cantilever structure. The gear rack 31 is longitudinally (along the Y direction in FIG. 2) formed on the top side of the foot pad 30 between the flat portion 34 and the shelter portion 33. The elastic portion 32 is disposed on the bottom side of the foot pad 30, wherein the elastic portion 32 may comprise rubber for better elasticity and friction. The two guiding portions 35 are formed on opposite sides of the foot pad 30 and parallel to the XY plane. In some embodiments, the guiding portions 35 are rectangular slots for guiding the foot pad 30 to slide relative to the main body 10.

Figure 3A:
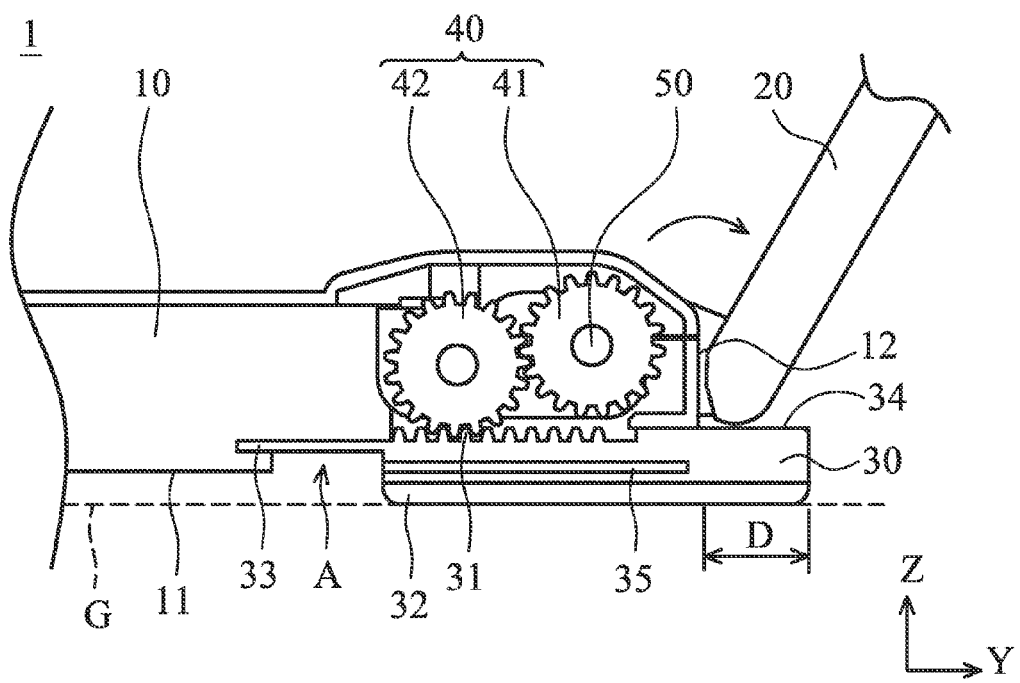
FIGS. 3A and 3B are perspective diagrams of an electronic device with the display in an open position relative to the main body according to an embodiment of the invention.
Figure 3B:
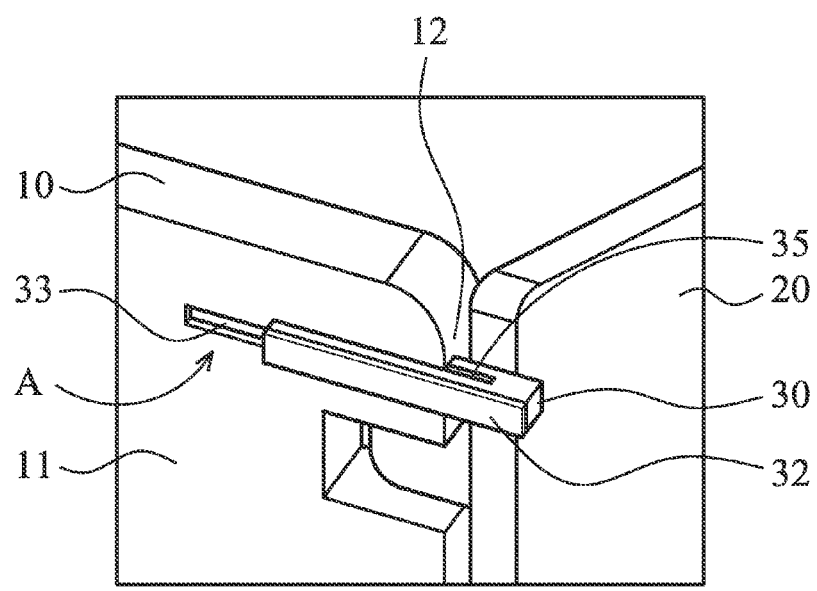

Referring to FIGS. 3A and 3B, when the display 20 is rotated from a closed position to an open position relative to the main body 10 (along the clockwise direction as the arrow indicated in FIG. 3A), the display 20 drives the shaft 50 and the first gear 41 to rotate, and the first gear 41 forces the second gear 42 to rotate in an opposite direction. Thus, the second gear 42 forces the gear rack 31 and the foot pad 30 to move along a first direction (the Y direction in FIG. 3A), such that the foot pad 30 protrudes from the rear side 12 of the main body 10 with the flat portion 34 exposed thereto. Furthermore, as shown in FIG. 3B, the display 20 may rotate to a predetermined position without obstructing the movement of the foot pad 30.

Specifically, when the display 20 is rotated from the open position to the closed position relative to the main body 10, the display 20 drives the transmission unit 40 to force the foot pad 30 to retract into the main body 10 along a second direction (the −Y direction in FIG. 3A) relative to the main body 10. As shown in FIG. 3B, while the foot pad 30 is to move, an opening A is formed between the bottom surface 11 of the main body 10 and the foot pad 30. The shelter portion 33 of the foot pad 30 can cover the opening A, to prevent dust from entering into the main body 10. It is noted that when the display 20 is rotated from the closed position to the open position relative to the main body 10, the foot pad 30 moves a distance D along the first direction (the Y direction in FIG. 3A), thus to move the fulcrum of the electronic device 1 to the right. With the protruding foot pad 30, the electronic device 1 can be stabilized and prevented from shaking or backward tilting.

Figure 4:
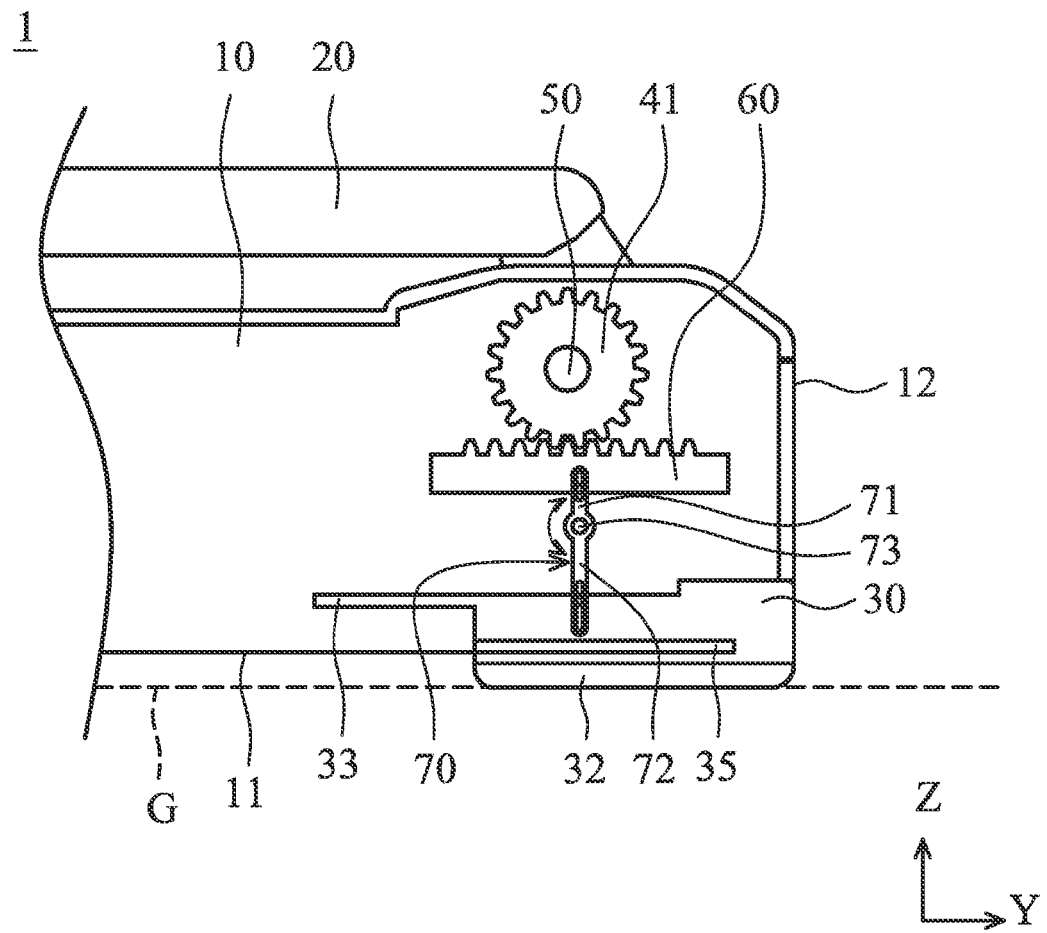
FIG. 4 is a perspective diagram of a transmission unit according to another embodiment of the invention.

Referring to FIG. 4, another embodiment of the transmission unit 40 comprises a first gear 41, a rack member 60, and a rotary member 70. The first gear 41 is pivotally connected to the display 20 via the shaft 50 and engaged with the rack member 60. The rotary member 70 is pivotally connected to the main body 10 by a pivot 73, forming a first arm 71 which is pivotally connected to the rack member 60 and a second arm 72 which is pivotally connected to the foot pad 30, wherein the length of the second arm 72 exceeds that of the first arm 71. When the display 20 is rotated from a closed position to the open position, the display 20 drives the first gear 41 to rotate in a clockwise direction to force the rack member 60 to move along the second direction (the −Y direction in FIG. 4). Subsequently, the rack member 60 pushes the rotary member 70 to force the foot pad 30 to move along the first direction (the Y direction in FIG. 4). Since the displacement of the second arm 72 in the Y direction exceeds that of the first arm 71 in the −Y direction during rotation of the rotary member 70, the moved distance of the foot pad 30 can be increased.

The invention provides an electronic device, comprising a main body, a display pivotally connected thereto, a foot pad disposed on the bottom side of the main body and at the edge thereof, and a transmission unit disposed in the main body. The transmission unit may have a rod, cam or gear mechanism, connecting the display with the foot pad. When the display is rotated from a closed position to an open position, the display drives the transmission unit to move the foot pad, and the foot pad protrudes from a rear side of the main body, thereby preventing the electronic device from shaking or backward tilting.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. An electronic device, comprising:
    a main body;
    a display, pivotally connected to the main body;
    a foot pad, disposed on the bottom side of the main body and at the edge thereof, wherein the foot pad contacts a supporting surface and is parallel thereto; and
    a transmission unit, disposed in the main body and connecting the foot pad with the display;
    wherein when the display is rotated from a closed position to an open position relative to the main body, the display drives the transmission unit to force the foot pad to move relative to the main body along a first direction, wherein the first direction is parallel to the supporting surface, and when the display is rotated from the open position to the closed position relative to the main body, the display drives the transmission unit to force the foot pad to move relative to the main body along a second direction opposite to the first direction;
    wherein the foot pad comprises a shelters portion, and when the foot pad moves relative to the main body along the first direction, an opening is formed between the foot pad and the main body, and the shelters portion covers the opening.

2. The electronic device as claimed in claim 1, wherein the foot pad comprises a gear rack, and the transmission unit comprises a first gear connected to the display and a second gear connecting the first gear with the gear rack, wherein when the display is rotated from the closed position to the open position, the display rotates and forces the gear rack to move along the first direction via the first gear and the second gear.

3. The electronic device as claimed in claim 2, wherein the first gear comprises metal and the second gear comprises plastic.

4. The electronic device as claimed in claim 1, wherein the foot pad comprises an elastic portion connected to the supporting surface.

5. The electronic device as claimed in claim 4, wherein the elastic portion comprises rubber.

6. The electronic device as claimed in claim 1, wherein the foot pad comprises a guiding portion connected to the main body, to guide the foot pad to move relative to the main body along the first direction.

7. The electronic device as claimed in claim 1, wherein the transmission unit has a rod, cam or gear mechanism.

8. An electronic device, comprising:
    a main body;
    a display, pivotally connected to the main body;
    a foot pad, disposed on the bottom side of the main body and at the edge thereof, wherein the foot pad contacts a supporting surface and is parallel thereto; and
    a transmission unit, disposed in the main body and connecting the foot pad with the display;
    wherein when the display is rotated from a closed position to an open position relative to the main body, the display drives the transmission unit to force the foot pad to move relative to the main body along a first direction, wherein the first direction is parallel to the supporting surface, and when the display is rotated from the open position to the closed position relative to the main body, the display drives the transmission unit to force the foot pad to move relative to the main body along a second direction opposite to the first direction, wherein the transmission unit comprises a first gear connected to the display, a rack member, and a rotary member pivotally connected to the main body and forming a first arm and a second arm, wherein the first arm is pivotally connected to the rack member, and the second arm is pivotally connected to the foot pad, and when the display is rotated from a closed position to the open position, the display drives the first gear to force the rack member to move along the second direction, wherein the rack member pushes the rotary member to force the foot pad to move along the first direction.

9. The electronic device as claimed in claim 8, wherein the length of the second arm exceeds that of the first arm.

* * * * *